(12) United States Patent
Frayer et al.

(10) Patent No.: US 8,910,020 B2
(45) Date of Patent: Dec. 9, 2014

(54) INTELLIGENT BIT RECOVERY FOR FLASH MEMORY

(75) Inventors: Jack Edward Frayer, Boulder Creek, CA (US); Aaron Keith Olbrich, Morgan Hill, CA (US); Paul Roger Stonelake, Santa Clara, CA (US); Anand Krishnamurthi Kulkarni, San Jose, CA (US); Yale Yueh Ma, Palo Alto, CA (US)

(73) Assignee: Sandisk Enterprise IP LLC, Milpitas, CA (US)

( * ) Notice: Subject to any disclaimer, the term of this patent is extended or adjusted under 35 U.S.C. 154(b) by 381 days.

(21) Appl. No.: 13/285,873

(22) Filed: Oct. 31, 2011

(65) Prior Publication Data

US 2012/0324276 A1 Dec. 20, 2012

Related U.S. Application Data

(60) Provisional application No. 61/498,585, filed on Jun. 19, 2011.

(51) Int. Cl.
| | |
|---|---|
| G11C 29/00 | (2006.01) |
| G11C 11/56 | (2006.01) |
| G11C 16/34 | (2006.01) |
| G11C 16/26 | (2006.01) |

(52) U.S. Cl.
CPC ........ G11C 16/3427 (2013.01); G11C 11/5642 (2013.01); G11C 16/3422 (2013.01); G11C 16/26 (2013.01)
USPC ........................................................ 714/764

(58) Field of Classification Search
CPC .............. G06F 11/004; G06F 11/1068; G06F 11/1072; G11C 16/3404; G11C 16/344; G11C 16/349; G11C 29/00; G11C 29/52; G11C 11/5628; G11C 11/5642; G11C 16/10; G11C 16/105; G11C 16/3413; G11C 16/3454; G11C 16/3463; G11C 16/3486; G11C 2211/5621
USPC .................. 714/718, 42, 6.11, 746, 764, 799, 714/E11.023, E11.029, 2, 37, 54, 758; 365/185.33; 711/E12.008, E12.103
See application file for complete search history.

(56) References Cited

U.S. PATENT DOCUMENTS

| | | |
|---|---|---|
| 4,916,652 A | 4/1990 | Schwarz et al. |
| 5,519,847 A | 5/1996 | Fandrich et al. |

(Continued)

FOREIGN PATENT DOCUMENTS

| | | |
|---|---|---|
| EP | 1465203 A1 | 10/2004 |
| EP | 1 990 921 A2 | 11/2008 |

(Continued)

OTHER PUBLICATIONS

Kang, A Multi-Channel Architecture for High-Performance NAND Flash-Based Storage System, J. Syst. Archit., 53, 9, Sep. 2007, 15 pgs.

(Continued)

*Primary Examiner* — Phung M Chung
(74) *Attorney, Agent, or Firm* — Morgan, Lewis & Bockius LLP

(57) ABSTRACT

A method and system for intelligent bit recovery identifies toggling bits, which change in value from one read to the next, and examines a subset of potential bit patterns. The subset is a fraction of the potential bit patterns, and is based on an understanding of the flash memory and the problems that may cause the toggling bits. The intelligent bit recovery may analyze at least one aspect of the flash memory to identify a problem, or plurality of problems, that is potentially causing the toggling bits, and to select the subset of potential bit patterns as potential solutions. The subset of potential bit patterns examined by the intelligent bit recovery is a small fraction of the entire set of potential bit patterns.

30 Claims, 9 Drawing Sheets

(56) References Cited

U.S. PATENT DOCUMENTS

| | | |
|---|---|---|
| 5,530,705 A | 6/1996 | Malone, Sr. |
| 5,537,555 A | 7/1996 | Landry et al. |
| 5,551,003 A | 8/1996 | Mattson et al. |
| 5,657,332 A | 8/1997 | Auclair et al. |
| 5,666,114 A | 9/1997 | Brodie et al. |
| 5,708,849 A | 1/1998 | Coke et al. |
| 5,943,692 A | 8/1999 | Marberg et al. |
| 5,982,664 A | 11/1999 | Watanabe |
| 6,000,006 A | 12/1999 | Bruce et al. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,032,123 B2 | 4/2006 | Kane et al. |
| 7,043,505 B1 | 5/2006 | Teague et al. |
| 7,100,002 B2 | 8/2006 | Shrader et al. |
| 7,111,293 B1 | 9/2006 | Hersh et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,069,390 B2 | 11/2011 | Lin |
| 8,190,967 B2 | 5/2012 | Hong et al. |
| 8,254,181 B2 * | 8/2012 | Hwang et al. ............ 365/185.25 |
| 8,312,349 B2 | 11/2012 | Reche et al. |
| 8,412,985 B1 | 4/2013 | Bowers et al. |
| 2002/0024846 A1 | 2/2002 | Kawahara et al. |
| 2002/0083299 A1 | 6/2002 | Van Huben et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0088805 A1 | 5/2003 | Majni et al. |
| 2003/0093628 A1 | 5/2003 | Matter et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Schrader et al. |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231755 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0053246 A1 | 3/2006 | Lee |
| 2006/0085671 A1 | 4/2006 | Majni et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0052446 A1 | 2/2008 | Lasser et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2009/0003058 A1 | 1/2009 | Kang |
| 2009/0037652 A1 | 2/2009 | Yu et al. |
| 2009/0144598 A1 | 6/2009 | Yoon et al. |

(56) References Cited

U.S. PATENT DOCUMENTS

| | | |
|---|---|---|
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0296466 A1 | 12/2009 | Kim et al. |
| 2009/0296486 A1 | 12/2009 | Kim et al. |
| 2009/0319864 A1 | 12/2009 | Shrader |
| 2010/0061151 A1 | 3/2010 | Miwa et al. |
| 2010/0103737 A1 | 4/2010 | Park |
| 2010/0161936 A1 | 6/2010 | Royer et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1* | 7/2011 | Filor et al. ............... 711/103 |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0195126 A1 | 8/2012 | Roohparvar |
| 2012/0239976 A1 | 9/2012 | Cometti et al. |
| 2012/0284587 A1 | 11/2012 | Yu et al. |

FOREIGN PATENT DOCUMENTS

| | | |
|---|---|---|
| JP | 2002-532806 | 10/2002 |
| WO | WO 2007/036834 A2 | 4/2007 |
| WO | WO 2007/080586 A2 | 7/2007 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |

OTHER PUBLICATIONS

Watchdog Timer and Power Savin Modes, Microchip Technology Inc., 2005 14 pgs.
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
Sandisk Enterprise, ISR/WO, PCT/US2012/059459, Feb. 14, 2013, 9 pgs.
SanDisk Enterprise, Office Action, CN 200880127623.8, Dec. 31, 2012, 9 pgs.
Sandisk Enterprise IP LLC, ISR/WO, PCT/US2012/042771, Mar. 4, 2013, 14 pgs.
SanDisk Enterprise, ISR/WO, PCT/US2012/042764, Aug. 31, 2012, 12 pgs.
SanDisk Enterprise, Office Action, Japanese Patent Application No. 2010-540863, Jul. 24, 2012, 3 pgs.
SanDisk Enterprise IP LLC, Office Action, Chinese Patent Application 200880127623.8, Apr. 18, 2012, 20 pgs.
Barr, Introduction to Watchdog Timers, Oct. 2001, 3 pgs.
Kim, A Space-Efficient Flash Translation Layer for CompactFlash Systems, IEEE Transactions on Consumer Electronics, vol. 48, No. 2, May 2002, pp. 366-375.
McLean, Information Technology-AT Attachment with Packet Interface Extension, Aug. 19, 1998, 339 pgs.
Park, A High Performance Controller for NAND Flash-based Solid State Disk (NSSD), Feb. 12-16, 2006, 4 pgs.
Pliant Technology, Inc., International Search Report and Written Opinion, PCT/US08/88133, Mar. 19, 2009, 7 pgs.
Pliant Technology, Inc., International Search Report and Written Opinion, PCT/US08/88136, Mar. 19, 2009, 7 pgs.
Pliant Technology, Inc., International Search Report and Written Opinion, PCT/US08/88146, Feb. 26, 2009, 10 pgs.
Pliant Technology, Inc., International Search Report and Written Opinion, PCT/US08/88154, Feb. 27, 2009, 8 pgs.
Pliant Technology, Inc., International Search Report and Written Opinion, PCT/US08/88164, Feb. 13, 2009, 8 pgs.
Pliant Technology, Inc., International Search Report and Written Opinion, PCT/US08/88206, Feb. 18, 2009, 7 pgs.
Pliant Technology, Inc., International Search Report and Written Opinion, PCT/US08/88217, Feb. 19, 2009, 7 pgs.
Pliant Technology, Inc., International Search Report and Written Opinion, PCT/US08/88229, Feb. 13, 2009, 7 pgs.
Pliant Technology, Inc. , International Search Report and Written Opinion, PCT/US08/88232, Feb. 19, 2009, 8 pgs.
Pliant Technology, Inc. , International Search Report and Written Opinion, PCT/US08/88236, Feb. 19, 2009, 7 pgs.
Pliant Technology, Inc., International Search Report and Written Opinion, PCT/US2011/028637, Oct. 27, 2011, 11 pgs.
Pliant Technology, Inc., Supplementary European Search Report, 08866997.3, Feb. 23, 2012, 6 pgs.
Zeidman, Verilog Designer's Library, 1999, 9 pgs.
SanDisk Enterprise, ISR/WO, PCT/US2012/042775, Sep. 26, 2012, 8 pgs.
International Search Report and Written Opinion dated Mar. 7, 2014 received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).

* cited by examiner

INTELLIGENT BIT RECOVERY FOR FLASH MEMORY

REFERENCE TO RELATED APPLICATION

This application claims the benefit of U.S. Provisional Application No. 61/498,585, filed Jun. 19, 2011, the entirety of U.S. Provisional Application No. 61/498,585 is hereby incorporated by reference herein.

TECHNICAL FIELD

This application relates generally to managing data in a memory system. More specifically, this application relates to a flash memory implementing an improved programming sequence to repair failing flash memory bits.

BACKGROUND

Flash memory is composed of flash memory cells that store bits, with a flash memory Single Level Cell (SLC) storing a single bit and a flash memory Multi-Level Cell (MLC) storing multiple bits. When reading the stored bits from the flash memory cells, the bits may toggle from one read to the next. These bits are termed toggle bits. The toggle bits are information that are stored on the tail of a particular state of a flash memory cell, and are intrinsically invalid as the toggle bits are in-between normal states.

One solution to the problem of toggling bits is to iteratively test each of the possible values of the toggling bits. For example, a page in flash memory may have N toggling bits. This solution iteratively flips through the N toggling bits (potentially through each of the $2^N$ possibilities), testing the possibilities using an error correction algorithm until the error correction algorithm indicates that one of the possibilities is valid. However, this solution is time-intensive (potentially requiring testing of $2^N$ possibilities) and may not yield the correct result (since the error correction algorithm may indicate that multiple of the $2^N$ possibilities are "valid").

Another solution is to read the flash memory cell several times and use the majority count to decide if the toggling bit should be a one or zero. Then, the data pattern is again fed into a decoding algorithm or other error correction algorithm in order to determine if a valid code word results. However, the values of the toggling bits are often erratic, so that a majority count may not yield the correct result.

Still another solution is to add more parity bytes and use a more complex error correction decoder. Parity bytes and error correction coding are typically used to correct for errors in reading the flash memory cells. The additional parity bytes and more complex decoder, while potentially correcting for the toggling bits, may overly complicate the operation of the flash memory.

SUMMARY

In order to address the problem of toggling bits, methods and systems are disclosed herein for intelligent bit recovery in a flash memory device.

According to a first aspect, a method of recovery of bits in the flash memory device is disclosed. The method comprises, in the flash memory device with a controller: determining N bits of data for recovery; selecting, based on at least one aspect of the flash memory device, potential bit patterns of the N bits, the potential bit patterns being smaller in number than $2^N$; and iteratively determining whether the potential bit patterns enable recovery of at least some of the N bits. Different types of analysis may be used in the bit recovery, including analysis to identify error bits, analysis to selects potential bit patterns for recovery of the error bits, and analysis to determine which of the selected potential bit patterns enables recovery of one or more of the error bits. For example, the N bit of data for recovery may be determined based on analysis to determine whether the N bits are toggling (such as based on reading the flash memory device multiple times and XORing the reads or using threshold shift commands).

As another example, the potential bit patterns may be selected based on one or more aspects of the flash device, such as based on: values of test bits (including whether one or more test '0' bits toggle to '1' or whether one or more test '1' bits toggle to '0'); a type of bits that are toggling (such as whether the bits that are toggling are single level cells or multi-level cells, or such as whether the bits that are toggling are upper page bits or lower page bits); and a mode of the flash memory device (such as whether the flash memory device is operating before or after baking).

One, some or all of the potential bit patterns (which are less than $2^N$ in number) may be used to recovery some or all of the N bits of data. For example, only the potential bit patterns for the particular flash memory device (such as if only bits in SLC cells are toggling, only bit patterns tailored to this problem) may be used. Alternatively, all of the potential bit patterns for all of the different aspects of the flash memory device may be used for iterative examination (such as bit patterns for both SLC and MLC cells may be used, even if only bits in MLC are toggling). In particular, because the number of bit patterns for all of the different aspects in the memory device are smaller in number than $2^N$ (and can be smaller than N), all of the potential bit patterns may be used as a set for potential bit patterns for iterative examination. Further, the iterative determination whether the potential bit patterns enable recovery may stop once a specific potential bit pattern enables recovery. Alternatively, the iterative determination whether the potential bit patterns enable recovery may examine all of the potential bit pattern to determine which specific bit pattern best enables recovery (such as the specific bit pattern enables recovery of the most bits).

In another aspect, a method of recovery of bits in a flash memory device caused by one or more potential flash memory problems is disclosed. The method comprises, in the flash memory device with a controller: determining N bits of data for recovery; selecting potential bit patterns of the N bits, the potential bit patterns for correction of the one or more potential flash memory problems and being smaller in number than $2^N$; and iteratively determining whether the potential bit patterns enable recovery of at least some of the N bits. The potential flash memory problems may include, for example, over-programming (which may cause bits in the memory cells to gain charge), retention loss (which may cause bits in the memory cells to lose charge) and/or media defects (which may be defects in the flash memory chip). Potential bit patterns may be associated with different potential flash problems. In one embodiment, only the potential bit patterns to solve one of the potential flash memory problems may be iteratively examined. Alternatively, potential bit patterns for more than one of the potential flash memory problems may be iteratively examined. For example, the potential bit patterns for problems due to both over-programming and retention loss may be examined. Further, the iterative determination whether the potential bit patterns enable recovery may stop once a specific potential bit pattern enables recovery. Alternatively, the iterative determination whether the potential bit patterns enable recovery may examine all of the potential bit pattern to determine which specific bit pattern best enables recovery.

In yet another aspect, a storage device is disclosed. The storage device may comprise a flash memory device that is configured to enable recovery of bits of data. The flash memory device comprises a memory and a controller in communication with the memory. The controller is configured to: determine N bits of data for recovery in the memory; select, based on at least one aspect of the flash memory device, potential bit patterns of the N bits, the potential bit patterns being smaller in number than $2^N$; and iteratively determine whether the potential bit patterns enable recovery of at least some of the N bits.

In still another aspect, a storage device is disclosed. The storage device may comprise a flash memory device that is configured to enable recovery of bits of data. The flash memory device comprises a memory and a controller in communication with the memory. The controller is configured to: determine N bits of data for recovery; select potential bit patterns of the N bits, the potential bit patterns for correction of the one or more potential flash memory problems and being smaller in number than $2^N$; and iteratively determine whether the potential bit patterns enable recovery of at least some of the N bits.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

Figure 1:
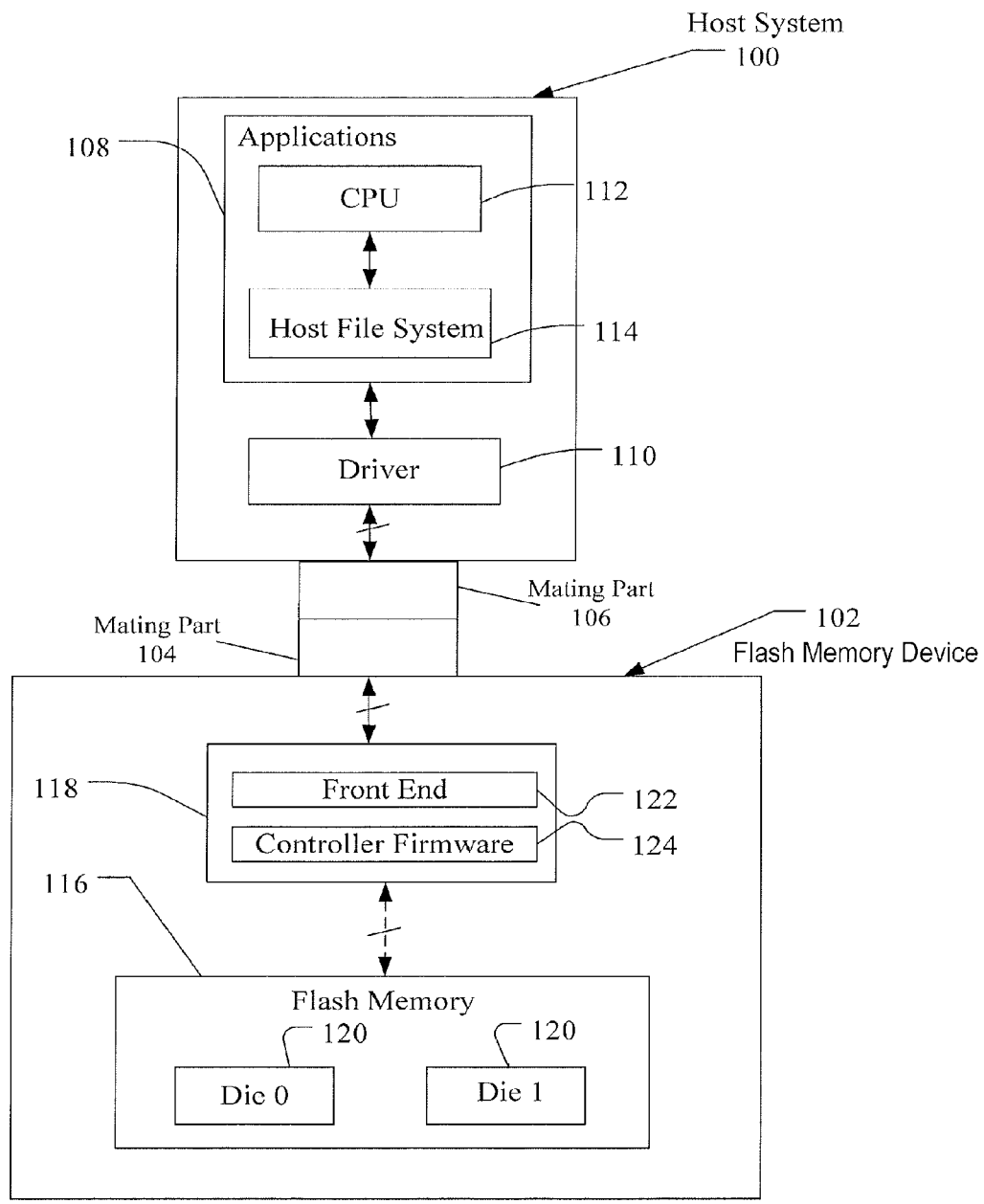
FIG. 1 illustrates a host connected with a memory device having a multi-bank non-volatile memory containing multiple die.

As discussed in the background, toggling bits are bits whose values toggle between different values. The intelligent bit recovery determines which bits are toggling, and examines a subset of the potential bit patterns to determine which in the subset of potential bit patterns is valid. For example, N bits may be found to be toggling. In one embodiment, there may be additional bits (such as M bits) that are also in error. The number of bits (N+M) may be too many bits for error correction (such Error Correction Coding (ECC)) to correct. The intelligent bit recovery, using the subset of potential bit patterns, may be used to reduce the number of bits in error, such as recovering some or all of the N bits that are toggling. For example, the intelligent bit recovery may recover n bits, where n<N. After application of the intelligent bit recovery, the remaining bits (N+M−n) may be recovered by ECC correction. For example, the remaining bits (N+M−n) may be compared with a predetermined number to determine whether the error correction coding may recover the remaining bits. If, using one of the potential bit patterns, the remaining bits are too large in number, ECC cannot correct the remaining bit so that another potential bit pattern is used.

In an alternate embodiment, the only bits in error are the N bits found to be toggling. In this embodiment, the intelligent bit recovery, using the subset of potential bit patterns, may be used to reduce the number of bits in error, such as recovering some or all of the N bits that are toggling.

The subset is a fraction of the potential bit patterns, and is based on an understanding of the flash memory and the problems that may cause the toggling bits. Different flash memories may have different bit assignments. As merely one example, a 2-bit MLC flash memory has a bit assignment, by upper page and lower page bit, of 11, 01, 00, and 10. Moreover, toggling bits may be caused by various problems. Examples of problems include: over-programming, which may cause bits in the memory cells to gain charge; retention loss, which may cause bits in the memory cells to lose charge; and media defects, which may be defects in the flash memory chip, such as, for example, defects in the NAND flash array or in the sense amplifiers. The charge in the cells of the flash memory may move due to the various problems, resulting in the bits to move as well, such as to the adjacent right or left state by over-programming or retention. By using this limiting condition and a physical understanding of flash memory, predictions may be made as to the specific bit patterns that may correct for the various problems. For example, in an MLC flash memory, predictions may be made for upper page bits and lower page bits assuming over-programming or retention loss. In this way, the subset of potential bit patterns is a fraction of the potential bit patterns. Specifically, the subset of potential bit patterns is significantly less than $2^N$, and is typically less than N.

In one aspect of the invention, the intelligent bit recovery performs different types of analysis in the recovery of bits, including analysis to identify error bits, analysis to select potential bit patterns for recovery of the error bits, and analysis to determine which of the selected potential bit patterns enables recovery of one or more of the error bits.

In the first type of analysis, as discussed in more detail below, there are multiple ways of identifying toggling bits, such as based on repetitive reads of the flash memory, as discussed below in FIG. 3, or based on read threshold shifts.

The second type of analysis selects the potential bit patterns for recovery. In one aspect of the selecting potential bit patterns analysis, at least one aspect of the flash memory is examined to identify which problem is potentially causing the toggling bits, and the subset of potential bit patterns (which corresponds to potential valid solutions for the identified problem) are selected as solutions for the determined problem. For example, the flash memory may include a test bit (or bits), which may be indicative of the problem causing the toggling bits. The test bit (or bits) may comprise 'FF00', which may be a series of '1's and '0's. The intelligent bit recovery may analyze the test bits to determine which bits are toggling, such as whether the '1's are toggling to '0's or whether the '0's are toggling to '1's. In a flash memory with a bit assignment, by upper page and lower page bit, of 11, 01, 00, and 10, over-programming may cause '1's to toggle to '0' and retention loss may cause '0's to toggle to '1's. So that, the analysis of the test bits may indicate the cause of the toggling, such as whether the cause is over-programming (if the test bit '1's toggle to '0's) or whether the cause is retention loss (if the test bit '0's toggle to '1's). As another example, the intelligent bit recovery may determine a mode of the flash memory, and identify the likely problem based on the mode. In particular, over-programming is more likely before baking, and retention loss is more likely after bake.

In another aspect of the selecting potential bit patterns analysis, the intelligent bit recovery selects potential bit patterns for multiple potential problems. For example, the subset of potential bit patterns may include one or more bit patterns to solve for over-programming and one or more bit patterns to solve for retention loss. In this aspect, there are more bit patterns to test for validity with error correction coding; however, there is no need to first identify the problem.

In still another aspect of the selecting potential bit patterns analysis, the intelligent bit recovery may select potential bit patterns based on a type of bit that is toggling. In the flash memory with a bit assignment, by upper page and lower page bit, of 11, 01, 00, and 10, the selection of potential bit patterns for toggling bits may be based on the value of the bits in the paired page. For example, the selection of potential bit patterns for upper page toggling bits may be based on the value of the bits in the lower page. In one case, the potential bit pattern for upper page toggling bits may be the inverse of the corresponding bits in the lower page. In another case, the potential bit pattern for upper page toggling bits may match the corresponding bits in the lower page. In this way, the intelligent bit recovery may identify the type of bit toggling (such as an upper bit), and select the potential bit patterns based on the identified type.

In yet another aspect of the selecting potential bit patterns analysis, the intelligent bit recovery may select potential bit patterns independent of the bit that is toggling. In a 2-bit MLC flash memory with a bit assignment, by upper page and lower page bit, of 11, 01, 00, and 10, the selection of potential bit patterns for lower page toggling bits may be independent of the value of the toggling bits, and may include two potential bit patterns with one potential bit pattern setting all toggling bits to zero (which may combat a retention loss error) and another potential bit pattern setting all toggling bits to one (which may combat an over-programming error). In a SLC flash memory, the selection of potential bit patterns for the toggling bits may be independent of the value of the toggling bits, and may include two potential bit patterns, with one potential bit pattern setting all toggling bits to zero and another potential bit pattern setting all toggling bits to one.

The third type of analysis determines which of the potential bit patterns enables recovery of some of the bits. As discussed in more detail below, error correction coding may be used to determine which of the potential bit patterns enables recovery of some or all of the N toggling bits.

A flash memory device suitable for use in implementing the intelligent bit recovery is shown in FIG. 1. A host system 100 of FIG. 1 stores data into and retrieves data from a flash memory device 102. The memory device may be flash memory embedded within the host, such as in the form of a solid state disk (SSD) drive installed in a personal computer. Alternatively, the flash memory device 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the flash memory device 102 internal to the host. SSD drives may be in the form of discrete modules that are drop-in replacements for rotating magnetic disk drives.

The host system 100 of FIG. 1 may be viewed as having two major parts, insofar as the flash memory device 102 is concerned, made up of a combination of circuitry and software. They are an applications portion 108 and a driver portion 110 that interfaces with the flash memory device 102. In a PC, for example, the applications portion 108 can include a processor, such as CPU 112, running word processing, graphics, control or other popular application software, as well as the file system 114 for managing data on the host 100. In a camera, cellular telephone or other host system that is primarily dedicated to perform a single set of functions, the applications portion 108 includes the software that operates the camera to take and store pictures, the cellular telephone to make and receive calls, and the like.

The flash memory device 102 of FIG. 1 may include non-volatile memory, such as flash memory 116, and a system controller 118 that both interfaces with the host 100 to which the flash memory device 102 is connected for passing data back and forth and controls the memory 116. The system controller 118 may convert between logical addresses of data used by the host 100 and physical addresses of the flash memory 116 during data programming and reading, and may include one or more methodologies for bit recovery in the flash memory 116, such as disclosed below in FIGS. 6-8. The flash memory 116 may include any number of memory dies 120. FIG. 1 illustrates two memory die simply by way of illustration. Functionally, the system controller 118 may include a front end 122 that interfaces with the host system, and controller firmware 124 for coordinating operation of the memory 116.

The system controller 118 may be implemented on a single integrated circuit chip, such as an application specific integrated circuit (ASIC). Each die 120 in the flash memory 116 may contain an array of memory cells organized into multiple planes. Alternatively, the memory cell array of a memory bank may not be divided into planes.

The memory cells may be operated to store more than two detectable levels of charge in each charge storage element or region, thereby to store more than one bit of data in each. This configuration is referred to as multi level cell (MLC) memory. Alternatively, the memory cells may be operated to store two levels of charge so that a single bit of data is stored in each cell. This is typically referred to as a binary or single level cell (SLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page. The order of the upper and lower page is merely for illustration purposes. Other orders are contemplated. As shown in the figures, the upper page is assigned to the most significant bit and the lower page is assigned to the least significant bit.

Again, this assignment is merely for illustration purposes and other assignments are contemplated.

Figure 2:
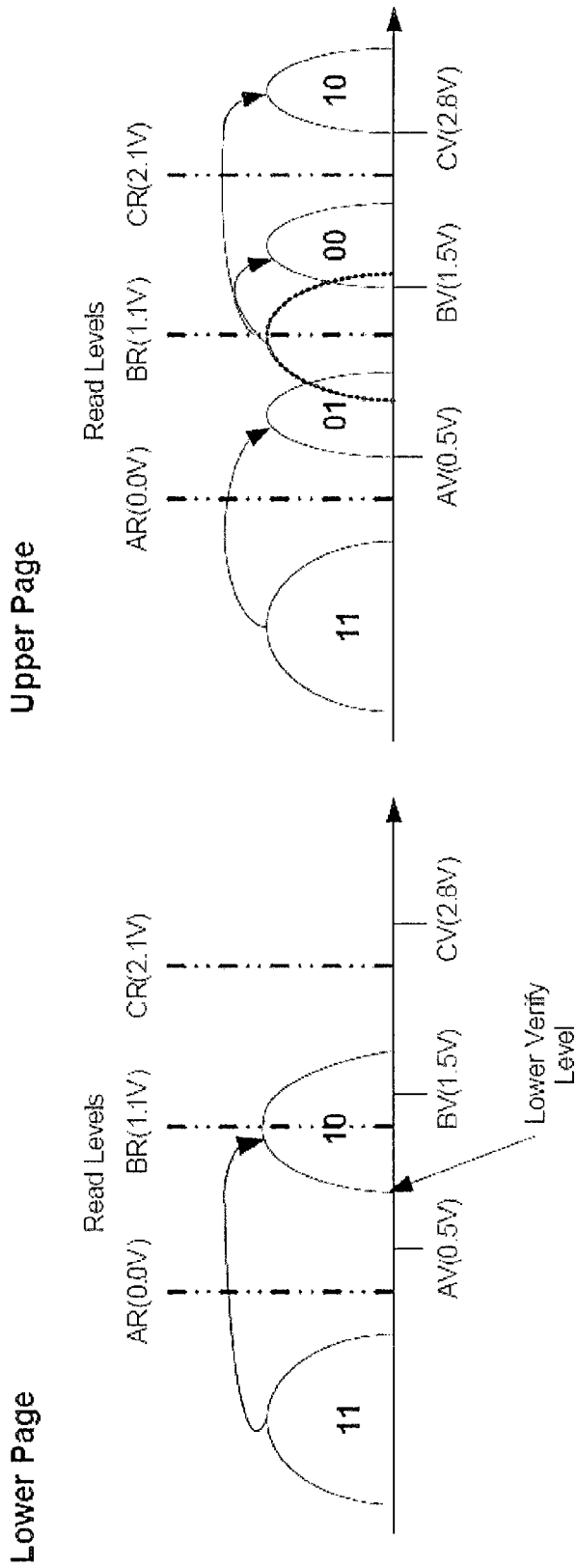
FIG. 2 illustrates charge levels in a MLC memory operated to store two bits of data in a memory cell.

FIG. 2 illustrates one implementation of the four charge levels used to represent two bits of data in a memory cell. A value of "11" corresponds to an unprogrammed state of the memory cell. When programming pulses are applied to the memory cell to program a page bit of the lower page, the level of charge is increased to represents a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an unprogrammed state (a value of "11"), applying programming pulses to the memory cell to program the page bit of the upper page increases the level of charge to represent a value of "01" corresponding to a programmed state of the page bit of the upper page. The voltage values indicated in FIG. 2 are merely for illustration purposes.

Figure 3:
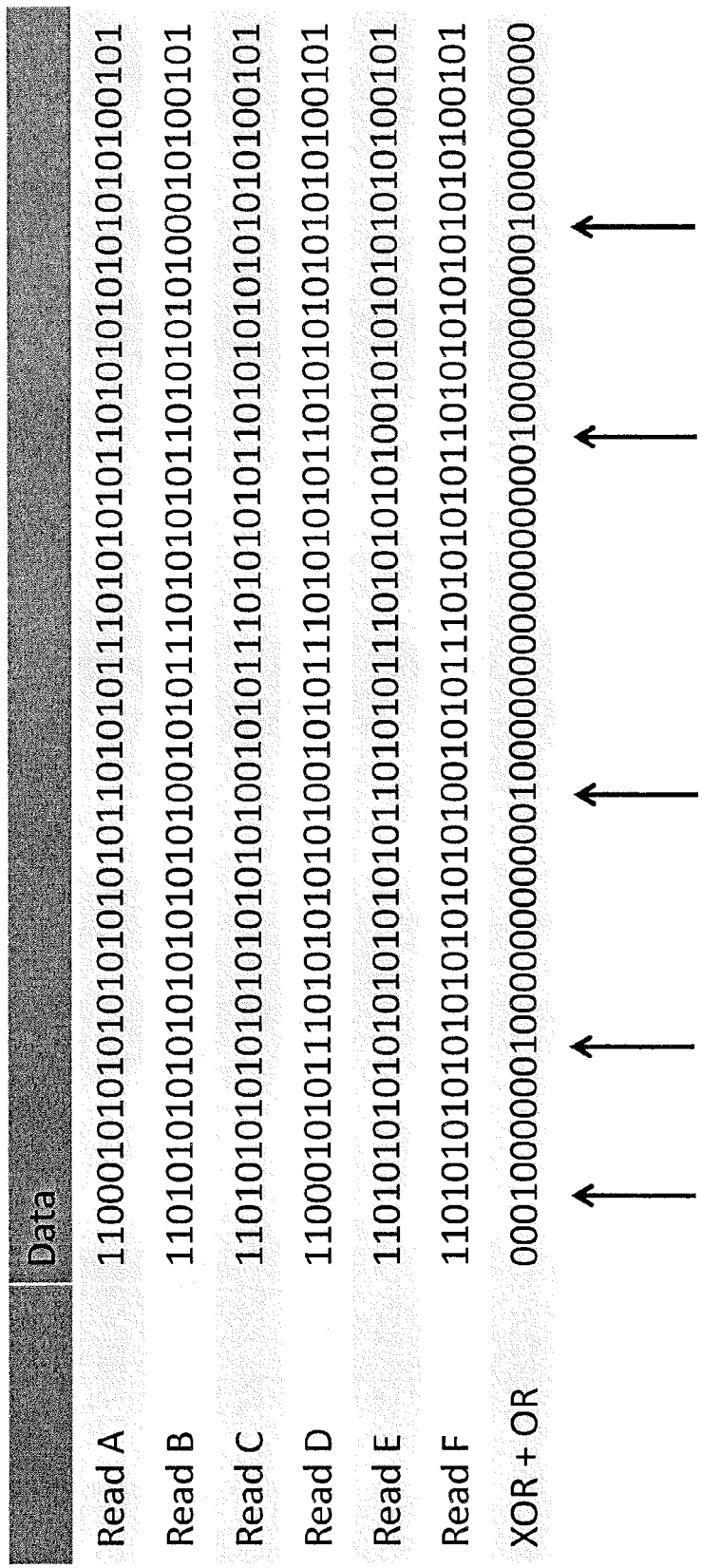
FIG. 3 illustrates values of different reads of flash memory, and an identification of toggling bits.

FIG. 3 illustrates values of different reads of flash memory, and an identification of toggling bits. As discussed with respect to FIG. 6, one or more bits in the flash memory are first detected as suspected of being in error. In one embodiment, to detect the toggling bits, the flash memory is read multiple times, such as 16 times or Reads A-F as indicated in FIG. 3, with each subsequent read data XORed. As shown by the arrows in FIG. 3, certain bits are in error and may be toggle bits.

Figure 4:
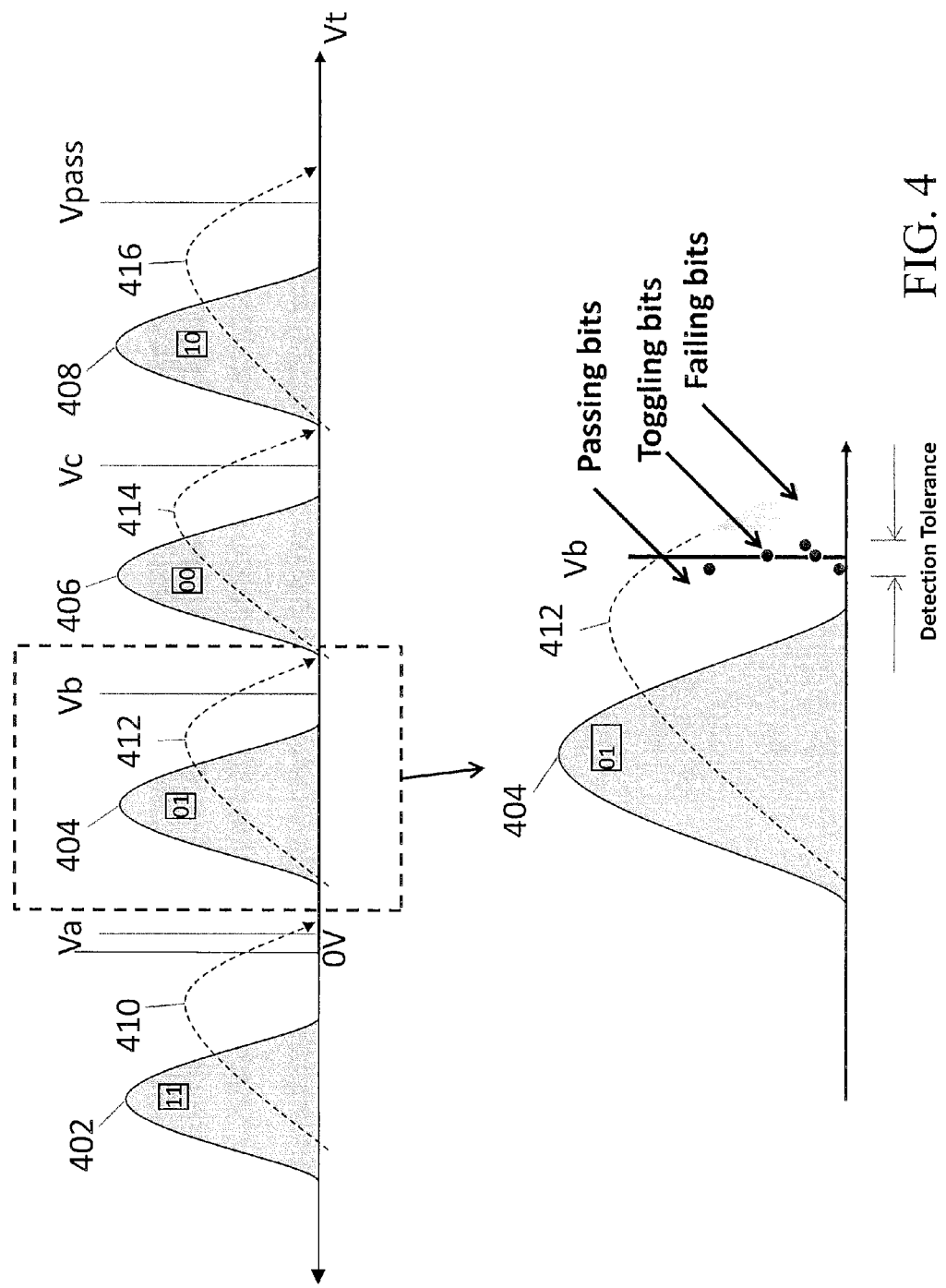
FIG. 4 illustrates charge levels in the MLC memory, and toggling bits due to effect of over-programming.
Figure 5:
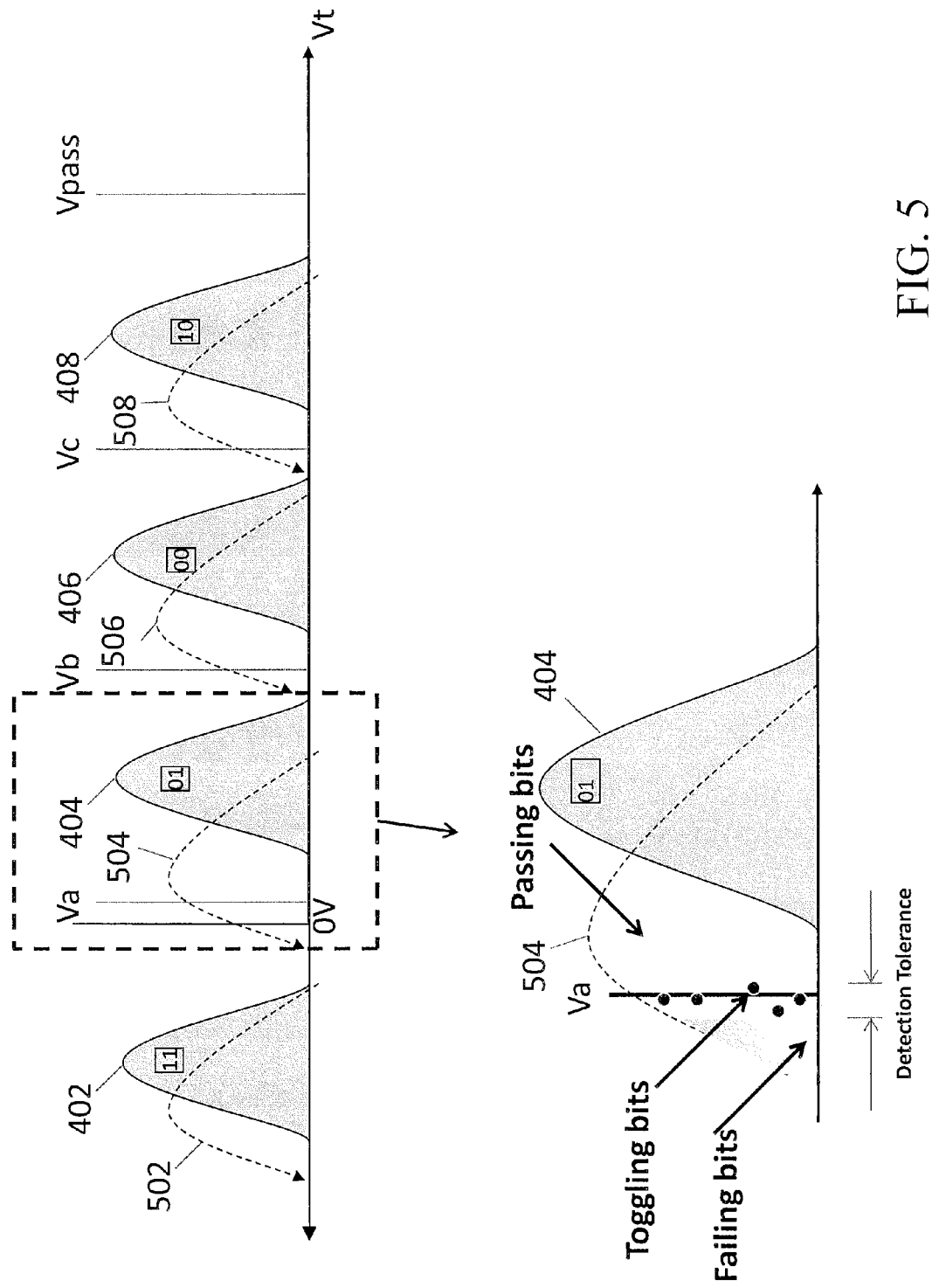
FIG. 5 illustrates charge levels in the MLC memory, and toggling bits due to effect of retention loss.

In an alternative embodiment, the toggling bits may be detected by using voltage threshold (Vt) shift commands to request the flash chips to move the read thresholds and then read the pages. As discussed in more detail below with respect to FIGS. 4 and 5, certain thresholds are used to demarcate a passing and a failing bit. For example, FIG. 4 illustrates Vb as the threshold in the midst of a window (illustrated as the detection tolerance), with the toggling bits falling within the window. Similarly, FIG. 5 illustrates Va as the threshold in the midst of a window (illustrated as the detection tolerance), with the toggling bits falling within the window. The threshold voltage (such as Va and/or Vb may be changed) and/or the width of the detection window may be changed (such as widened) to determine whether more bits fall within the modified window and are therefore toggling.

Moreover, bits that are toggling may actually "harden" when performing multiple reads of the page being recovered. In particular, read disturb is a potential failure mechanism where the act of reading a page too often causes the bits distributions to move. The multiple reads to determine the toggling bits may cause the paired page bits to move as well. Therefore, the methodology may read the paired page (and store the value as a reference for later use) before actually attempting to locate toggling bits. Specifically, reference reads of upper and lower pages may be carried out before multiple reads of the page for detecting toggle bits. The reference reads may thus avoid losing toggle bits to read disturbs.

The number of toggling bits may be high, for example, as high as 40% or even higher, with the possibility that the code word could be fixed using the intelligent bit recovery methodology disclosed. Unlike ordinary ECC methods, there is potentially no limit on the number of bits that may be corrected using this methodology.

Referring to FIG. 4, there is shown the effect of errors due to over-programming on a specific type of MLC. In particular, FIG. 4 illustrates ideal charge levels 402, 404, 406, 408 for bits 11, 01, 00, 10, respectively. Further, there is shown curves 410, 412, 414, 416 which illustrate the potential charge levels due to effect of over-programming. The Va, Vb, and Vc are read reference voltages. As shown in the lower portion of FIG. 4, different sections are shown as passing bits, toggling bits (falling within the detection tolerance), and failing bits. Thus, FIG. 4 illustrates one example of the effect of over-programming on the values of the bits in 2-bit MLC flash memory, and provides an understanding as to the selection of the bit patterns for use in the Intelligent Bit Recovery, discussed subsequently. FIG. 4 is for illustration purposes. Other types of flash memory layouts may be affected differently by over-programming.

Similar to FIG. 4, FIG. 5 illustrates ideal charge levels 402, 404, 406, 408 for bits 11, 01, 00, 10, respectively. Further, there is shown curves 502, 504, 506, 508 which illustrate the potential charge levels due to effect of retention loss. As shown in the lower portion of FIG. 5, different sections are shown as passing bits, toggling bits (falling within the detection tolerance), and failing bits. Thus, FIG. 5 illustrates one example of the effect of retention-loss on the values of the bits in 2-bit MLC flash memory, and provides an understanding as to the selection of the bit patterns for use in the intelligent bit recovery, discussed subsequently. FIG. 5 is for illustration purposes. Other types of flash memory layouts may be affected differently by retention loss.

Figure 6:
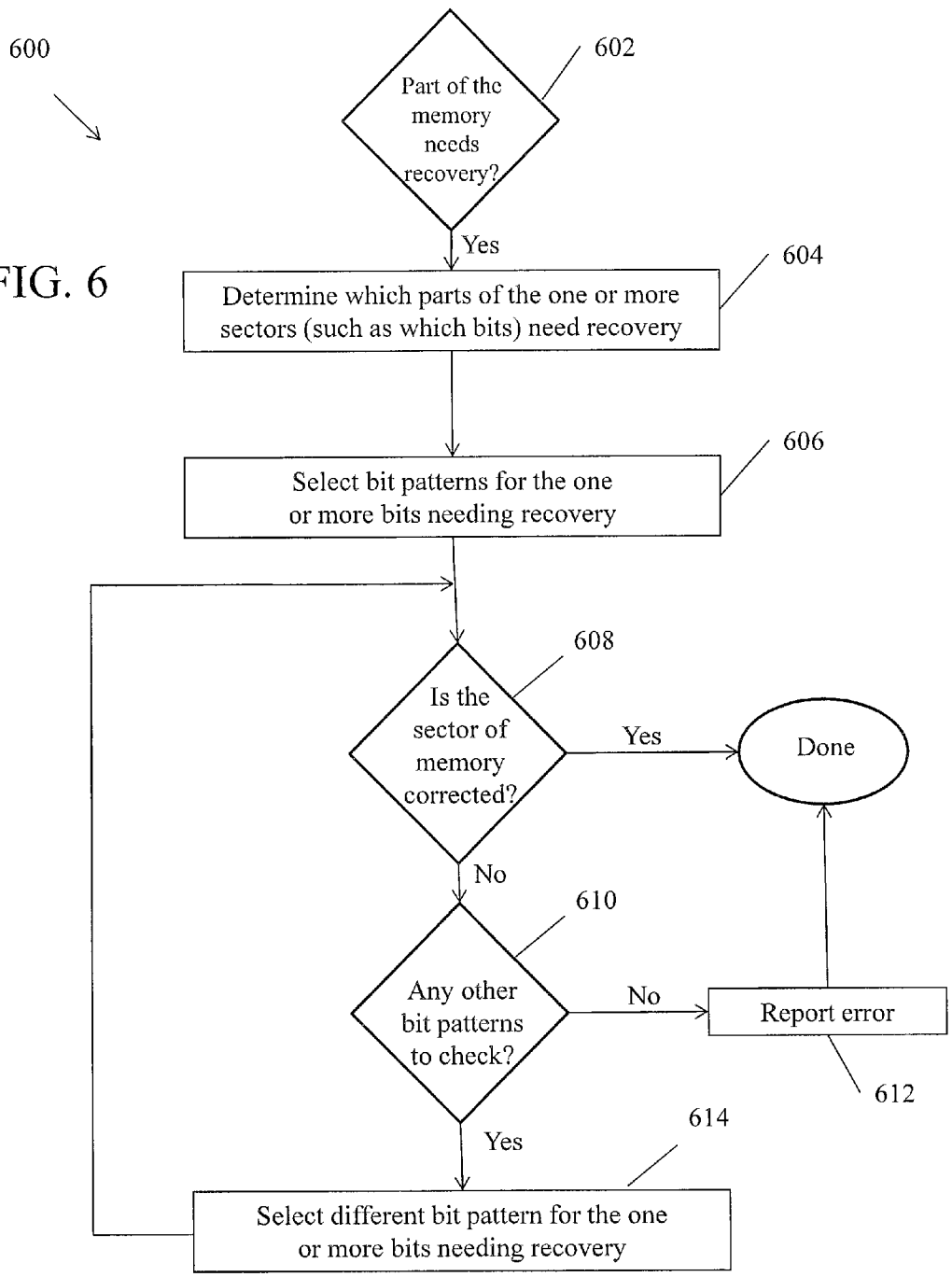
FIG. 6 is a flow chart of one method for correcting errors due to toggling bits using the intelligent bit recovery.

FIG. 6 is a flow chart 600 of one method for correcting errors due to toggling bits using the intelligent bit recovery. At 602, the controller (such as system controller 118) determines whether part of the flash memory, such as one or more sectors within the flash memory, needs recovery. One way to determine whether a part of the flash memory needs recovery is by using error correction. Error correction, such as forward error correction, may include generating redundant data, including error correction codes (ECC). Analysis of the ECC may be used to detect and correct errors introduced during storage of data in the flash memory. For example, the ECC for the one or more sectors may be analyzed to determine whether the data stored in the one or more sectors needs recovery.

At 604, if the controller determines that the memory needs recovery, it is determined which parts of the one or more sectors (such as which bits within the sectors) need recovery. An example of this is illustrated in FIG. 3.

Figure 9:
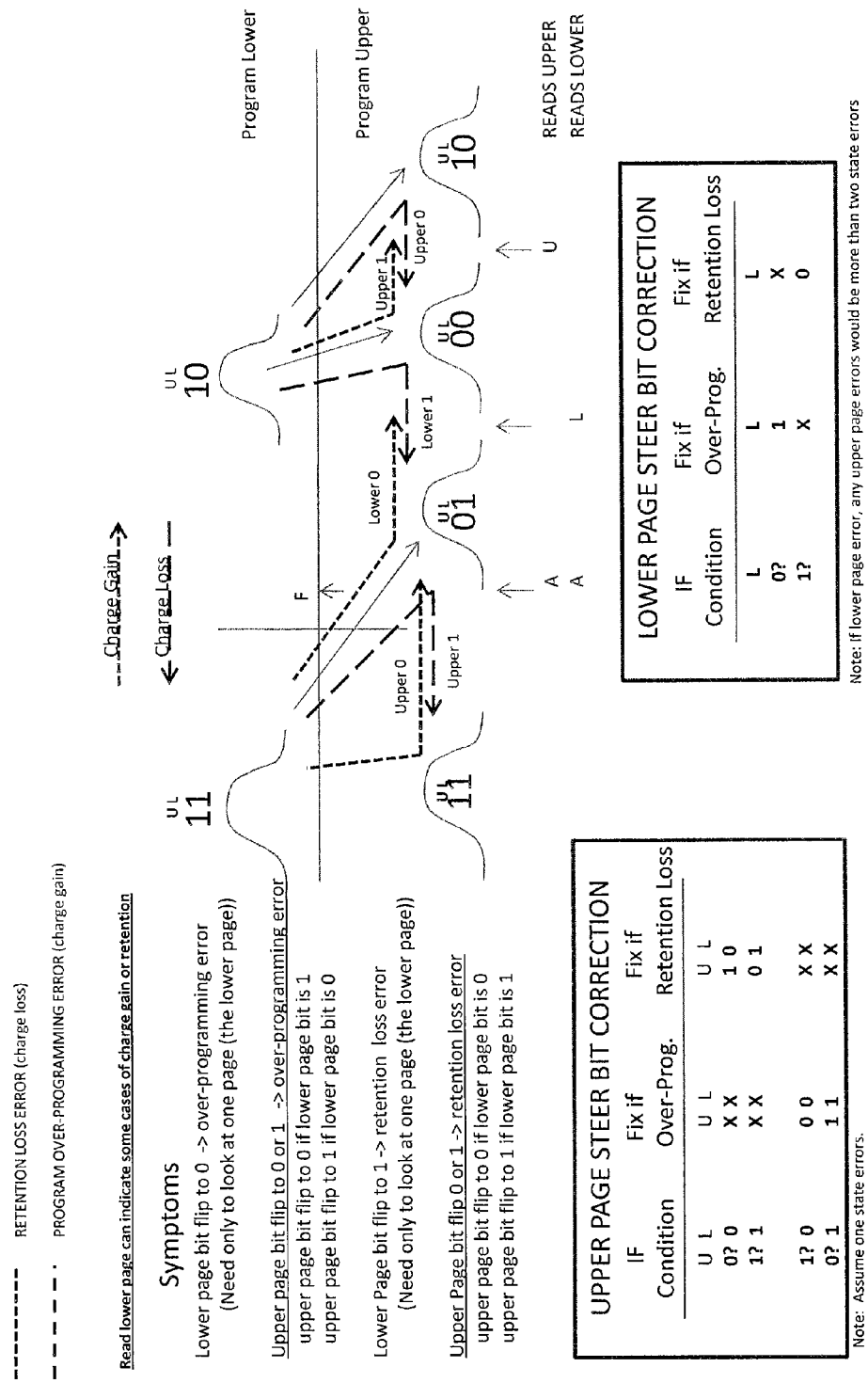
FIG. 9 illustrates the effect of various errors on a particular layout of flash memory.

At 606, bit patterns for the one or more bits needing recovery are selected. The values selected are a subset of all of the potential values, and are based on an understanding of the flash memory and the problems that may cause the toggling bits. Different flash memories may have different bit assignments. As merely one example illustrated in FIGS. 3-4, a 2-bit MLC flash memory has a bit assignment, by upper page and lower page bit, of 11, 01, 00, and 10. Moreover, toggling bits may be caused by various problems. Examples of problems include over-programming (illustrated in FIG. 3), and retention loss (illustrated in FIG. 4). The charge in the cells of the flash memory may move due to the various problems, resulting in the bits to move as well, such as to the adjacent right or left state by over-programming or retention. By using this limiting condition and a physical understanding of flash memory, predictions may be made as to the specific bit patterns that may correct for the various problems. For example, in a 2-bit MLC flash memory, predictions may be made for upper page bits and lower page bits assuming over-programming or retention loss based on the illustrations shown in FIGS. 3-4. FIG. 9 illustrates tables showing the potential bit values. In this way, the subset of potential bit patterns is a fraction of the potential bit patterns. Specifically, using one or more aspects of the flash memory device allows for the reduction from the entire set of potential bit patterns to the subset of potential bit patterns, which is significantly less than $2^N$, and is typically less than N.

One or more aspects of the flash memory device may be used to select the subset of potential bit patterns. In one embodiment, the selection of the potential bit patterns may be determined based on a dynamic aspect of the flash memory. The test bits may be used to determine if the majority movement is towards charge gain or charge loss as shown on FIG. 9. As one example, the flash memory may dynamically analyze a test bit (or bits). The analysis of the test bit (or bits) may indicate the problem causing the toggling bits. The test bit (or bits) may comprise 'FF00', which may be a series of '1's and '0's. The intelligent bit recovery may analyze the test bits to determine which bits are toggling, such as whether the '1's are toggling to '0's or whether the '0's are toggling to '1's. In a flash memory with a bit assignment, by upper page and lower page bit, of 11, 01, 00, and 10, over-programming may cause '1's to toggle to '0' and retention loss may cause '0's to toggle to '1's. So that, the analysis of the test bits may indicate the cause of the toggling, such as whether the cause is over-programming (if the test bit '1's toggle to '0's) or whether the cause is retention loss (if the test bit '0's toggle to '1's). Moreover, the analysis of the test bits may indicate which bits are toggling, such as the upper page test bits or the lower page test bits. These examples are merely for illustration of a particular example of the charge gain or charge loss. Other configurations are contemplated, and other indications of over-programming and retention loss are contemplated. To obtain a good sampling, several of these flag or test bits may be used. As still another example, the intelligent bit recovery may determine a mode of the flash memory, and identify the likely problem based on the mode. In particular, over-programming is more likely before baking, and retention loss is more likely after bake.

In another embodiment, the selection of the potential bit patterns may be determined based on a dynamic aspect of the flash memory.

Figure 8:
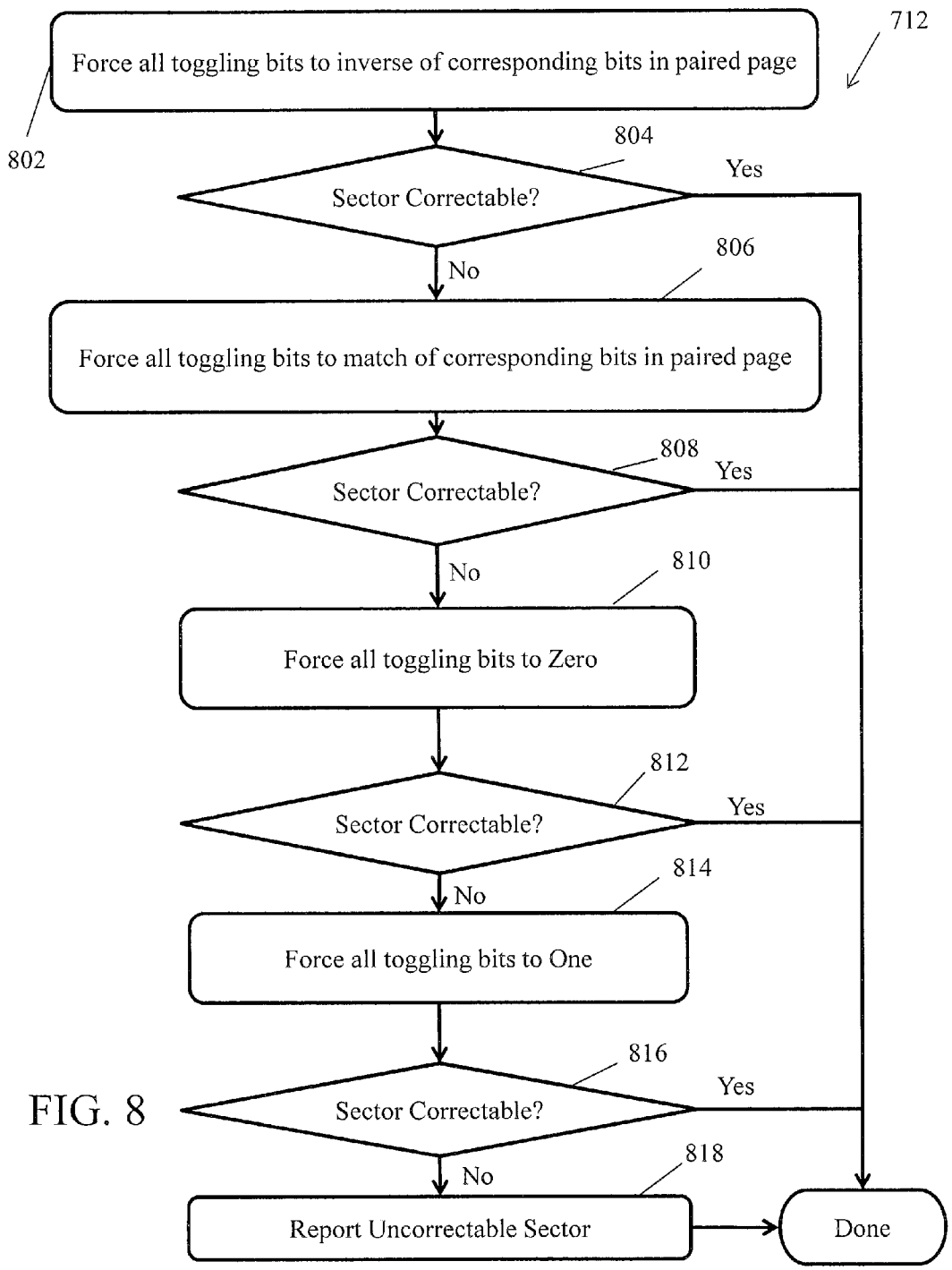
FIG. 8 is a flow chart of one example of intelligent bit recovery used in FIG. 7.

In still another embodiment, the intelligent bit recovery may select potential bit patterns for multiple potential problems. For example, the subset of potential bit patterns may include one or more bit patterns to solve for over-programming and one or more bit patterns to solve for retention loss. In this aspect, there are more bit patterns to test for validity with error correction coding; however, there is no need to first identify the problem. An example of the different bit patterns used to solve multiple potential problems is illustrated in FIG. 8.

Once the bit patterns are selected, the selected bit patterns are tested. At 608, using a selected bit pattern, ECC is analyzed to determine whether ECC indicates that the errors in the toggling bits are corrected. If so, the flow chart 600 is done. If not, at 610, it is determined whether there are additional bit patterns. If so, at 612, a different bit pattern is selected and the flow chart returns to 608. If not, an error is reported at 612 and the flow chart 600 is done.

Figure 7:
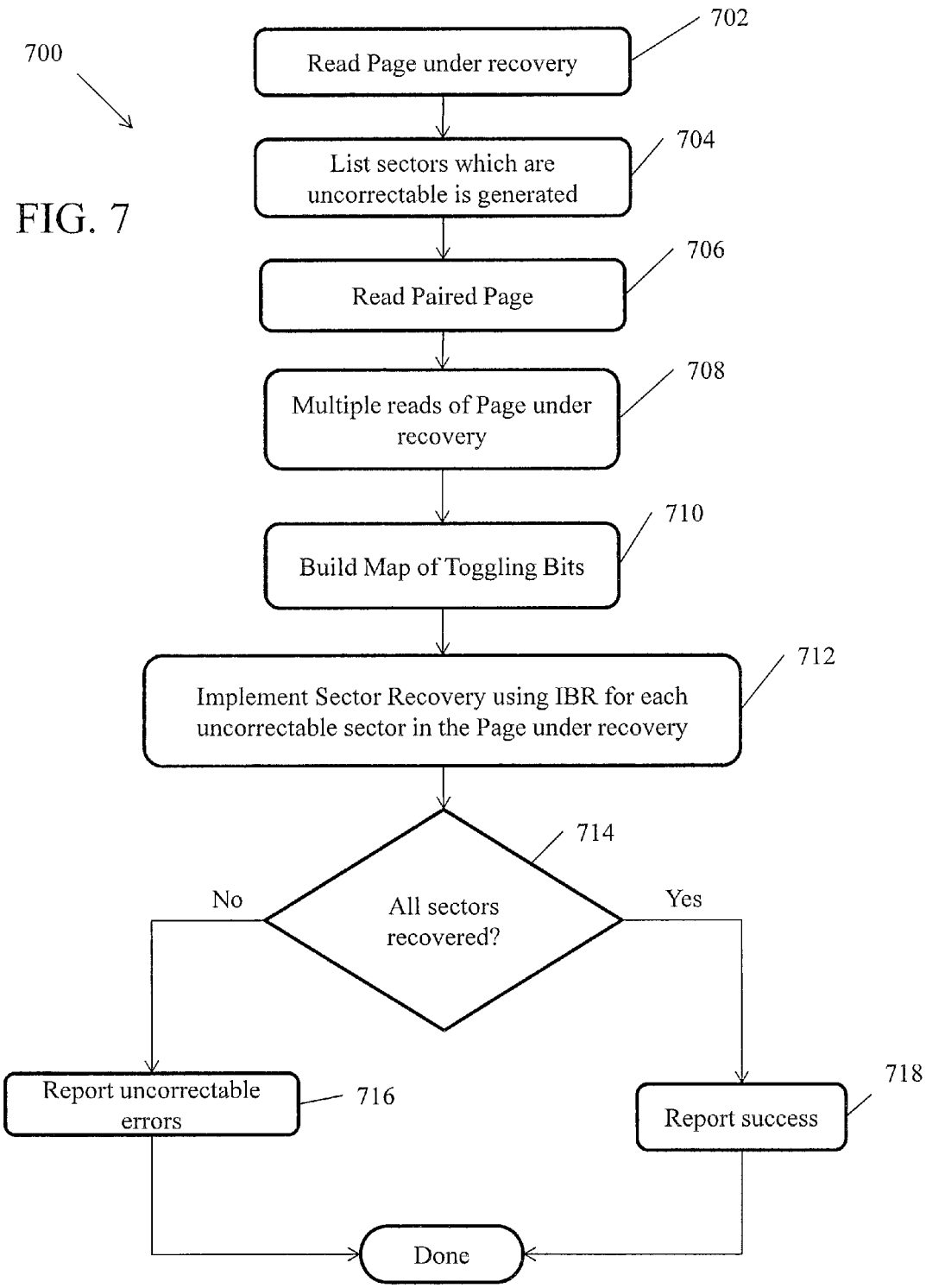
FIG. 7 is a flow chart of another method for correcting errors due to toggling bits using the intelligent bit recovery.

FIG. 7 is a flow chart 700 of another method for correcting errors due to toggling bits using the intelligent bit recovery. At 702, the page under recovery is read. Based on the read in 702, a list of the sectors which are uncorrectable using ECC is generated at 704. At 706, the paired page is read. The paired page refers to the upper page if the lower page is being recovered. Likewise, the paired page refers to the lower page if the upper page is being recovered. At 708, multiple reads of the page under recovery is performed. And, at 710, the map of the toggling bits is generated (such as illustrated by the arrows in FIG. 3).

At 712, sector recovery is implemented using Intelligent Bit Recovery (IBR) for each uncorrectable sector in the Page under recovery. An expansion of block 712 is illustrated in FIG. 8. At 714, it is determined whether all sectors were recovered. If so, success is reported at 718. If not, uncorrectable errors are reported at 716.

FIG. 8 is a flow chart of one example of Intelligent Bit Recovery used at 712 in FIG. 7. FIG. 8 illustrates trying bit patterns that solve different potential problems (such as for both over-programming and retention loss), and that solve for different types of toggling bits (for upper page toggling bits and lower page toggling bits). At 802, all of the toggling bits are forced to be the inverse of the corresponding bits on the paired page. As shown in FIG. 9, this potential solution may be more applicable to toggling bits in the upper pages (where the toggling bits in the upper page are forced to be the inverse of the value of the corresponding lower page bit). At 804, this potential solution is examined with ECC to determine if the sector is correctable. If so, the IBR is done. As discussed above, there may be N bits that are toggling. There may be additional bits (such as M bits) that are also in error. The number of bits (N+M) may be too many bits for error correction (such Error Correction Coding (ECC)) to correct. The intelligent bit recovery, using the potential bit patterns of forcing all toggling bits to the inverse of the corresponding bits in the paired page, may be used to reduce the number of bits in error, such as recovering some or all of the N bits that are toggling. For example, the intelligent bit recovery may recover n bits, where n<N. After application of the intelligent bit recovery, the remaining bits (N+M−n) may be recovered by ECC correction. If so, IBR was able to reduce the number of bits in error to the point that ECC correction is able to correct the remaining bits in error (i.e., the number of bits in error is within the correction power of ECC).

If not, at 806, all of the toggling bits are forced to match the corresponding bits on the paired page. As shown in FIG. 9, this potential solution may be more applicable to toggling bits in the upper pages (where the toggling bits in the upper page are forced to match the value of the corresponding lower page bit).

At 808, this potential solution is examined with ECC to determine if the sector is correctable. If so, the IBR is done. If not, at 810, all of the toggling bits are forced to zero. As shown in FIG. 9, this potential solution may be more applicable to toggling bits in the lower pages. At 812, this potential solution is examined with ECC to determine if the sector is correctable. If so, the IBR is done. If not, at 814, all of the toggling bits are forced to one. As shown in FIG. 9, this potential solution may be more applicable to toggling bits in the lower pages. At 816, this potential solution is examined with ECC to determine if the sector is correctable. If so, the IBR is done. If not, at 818, an uncorrectable sector is reported.

FIG. 9 illustrates the effect for various errors (include over-programming and retention loss). The effects are charted based on the layout of the 2-bit MLC illustrated in FIG. 9. Further, the symptoms and the potential bit pattern solutions are shown for upper page bits and lower page bits.

While the above examples describe a 2-bit MLC, IBR may be applied to different cells. For example, IBR may be applied to MLCs that are more than 2-bits, such as 3-bit MLC, 4-bit MLC, etc. The IBR for the more than 2-bit MLC may likewise focus on errors due to over-programming and loss retention. In particular, for a 3-bit MLC, the movement of charge for the various errors (such as over-programming and retention loss)

may be analyzed, and the effect of the movement of charge on the values in each of the three pages. This analysis may be used to decide which bit patterns to propose, similar to the bit patterns proposed for the 2-bit MLC discussed above.

It is intended that the foregoing detailed description be understood as an illustration of selected forms that the invention can take and not as a definition of the invention. It is only the following claims, including all equivalents, which are intended to define the scope of this invention. Also, some of the following claims may state that a component is operative to perform a certain function or configured for a certain task. It should be noted that these are not restrictive limitations. It should also be noted that the acts recited in the claims can be performed in any order and not necessarily in the order in which they are recited.

What is claimed is:

1. A method of recovery of bits in a flash memory device, the method performed by a controller of the flash memory device, the method comprising:
   at the controller of the flash memory device:
      determining N bits of data for recovery, wherein the N bits of data comprise a subset of bits of data read in a read operation and N is an integer greater than 1;
      selecting, based at least in part on one or more aspects of the flash memory device, a plurality of potential bit patterns of the N bits, wherein a count of plurality of potential bit patterns is less than $2^N$; and
      after selecting the plurality of potential bit patterns, iteratively determining whether a potential bit pattern of the plurality of potential bit patterns enables recovery of at least one or more of the N bits.

2. The method of claim 1, wherein the N bits of data for recovery are determined by reading multiple times a set of bits that include the N bits of data to identify the N bits of data as bits of data having inconsistent value across the multiple readings.

3. The method of claim 1, further comprising, identifying one or more potential problems with the flash memory device; and
   wherein the plurality of potential bit patterns are selected based in part on the one or more identified potential problems.

4. The method of claim 3, wherein identifying the one or more potential problems includes analyzing test bits to identify one of over-programming or loss retention.

5. The method of claim 1, wherein the plurality potential bit patterns are selected based at least in part on a type of at least a portion of the flash memory device.

6. The method of claim 1, wherein the plurality potential bit patterns are selected based at least in part on whether the N bits of data for recovery are in single level cells or multilevel cells.

7. The method of claim 1, wherein the plurality of potential bit patterns are selected based at least in part on values of the N bits of data for recovery.

8. The method of claim 1, wherein the plurality of potential bit patterns are selected independent of values of the N bits of data for recovery.

9. The method of claim 1, wherein the flash memory device includes multilevel cells; and
   wherein the N bits for recovery are in a page under recovery; and
   wherein the plurality of potential bit patterns are selected based at least in part on which bit in the multi-level cell is subject to recovery.

10. The method of claim 9, wherein the multi-level cells comprise 2-bit multilevel cells with an upper page and a lower page;
    wherein the page under recovery is the upper page;
    wherein a paired page corresponding to the page under recovery is the lower page; and
    wherein the plurality of potential bit patterns are selected based at least in part on values of bits in the lower page.

11. The method of claim 1, wherein iteratively determining whether the plurality of potential bit patterns enable recovery of at least one or more of the N bits comprises analyzing the plurality of potential bit patterns with error correction coding.

12. A method of recovering bits in a flash memory device, the method performed by a controller of the flash memory device, the method comprising:
    at the controller of the flash memory device:
       determining N bits of data for recovery wherein the N bits of data comprise a subset of bits of data read in a read operation and N is an integer greater than 1;
       selecting a plurality of potential bit patterns for correction of one or more potential flash memory problems with the N bits, wherein a count of the plurality of potential bit patterns is less than $2^N$;
       after selecting the plurality of potential bit patterns, iteratively determining whether a potential bit pattern of the plurality of potential bit patterns enables recovery of at least one or more of the N bits and recovering a subset of the N bits using a selected bit pattern of the plurality of potential bit patterns; and
       after recovering the subset of the N bits, recovering remaining bits of the N bits using ECC correction.

13. The method of claim 12, wherein the plurality of potential bit patterns are selected for correction of one or both of over-programming and retention loss.

14. The method of claim 12, wherein determining N bits of data for recovery by reading multiple times a set of bits that include the N bits of data to identify the N bits of data as bits of data having inconsistent value across the multiple reading times.

15. The method of claim 14, further comprising determining M bits of data that are further in error; and
    wherein iteratively determining whether the potential bit patterns enable recovery of at least one or more of the N bits comprises determining whether one of the plurality of potential bit patterns recovers a predetermined number of bits to correct for N+M error bits.

16. A flash memory device comprising:
    a memory; and
    a controller in communication with the memory, the controller configured to:
       determine N bits of data in the memory for recovery, wherein the N bits of data comprise a subset of bits of data read in a read operation and N is an integer greater than 1;
       select, based at least in part on one or more aspects of the flash memory device, a plurality of potential bit patterns of the N bits, wherein a count of the plurality of potential bit patterns is less than $2^N$; and
       after selecting the plurality of potential bit patterns, iteratively determine whether a potential bit pattern of the plurality of potential bit patterns enables recovery of at least one or more of the N bits.

17. The flash memory device of claim 16, wherein the controller is configured to determine the N bits of data for recovery by reading multiple times a set of bits that include the N bits of data to identify the N bits of data as bits of data having inconsistent value across the multiple reading times.

18. The flash memory device of claim 16, further comprising, identifying one or more potential problems with the flash memory device; and wherein the plurality of potential bit patterns are selected based at least in part on the one or more identified potential problems.

19. The flash memory device of claim 18, wherein the controller is configured to identify the one or more potential problems by analyzing test bits to identify one of over-programming or loss retention.

20. The flash memory device of claim 16, wherein the controller is configured to select the plurality of potential bit patterns based at least in part on a type of at least a portion of the flash memory device.

21. The flash memory device of claim 16, wherein the controller is configured to select the plurality of potential bit patterns based at least in part on whether the N bits of data for recovery are in a single level cells or multi-level cells.

22. The flash memory device of claim 16, wherein the controller is configured to select the plurality of potential bit patterns based at least in part on values of the N bits of data for recovery.

23. The flash memory device of claim 16, wherein the controller is configured to select the plurality of potential bit patterns independent of values of the N bits of data for recovery.

24. The flash memory device of claim 16, wherein the memory includes multilevel cells;

wherein the N bits for recovery are in a page under recovery; and wherein the controller is configured to select the plurality of potential bit patterns based at least in part on which bit in the multi-level cell is subject to recovery.

25. The flash memory device of claim 24, wherein the multi-level cells comprise 2-bit multi-level cells with an upper page and a lower page;

wherein the page under recovery is the upper page;

wherein a paired page corresponding to the page under recovery is the lower page; and wherein the controller is configured to select the plurality of potential bit patterns based at least in part of values of one or more bits in the lower page.

26. The flash memory device of claim 16, wherein the controller is configured to iteratively determine whether the plurality of potential bit patterns enable recovery of at least one or more of the N bits by analyzing the plurality of potential bit patterns with error correction coding.

27. A flash memory device comprising a memory; and a controller in communication with the memory, the controller configured to:

determine N bits of data for recovery, wherein the N bits of data comprise a subset of bits of data read in a read operation and N is an integer greater than 1;

select a plurality of potential bit patterns for correction of the one or more potential flash memory problems with the N bits, wherein a count of the plurality of potential bit patterns is less than $2^N$;

after selecting the plurality of potential bit patterns, iteratively determine whether a potential bit pattern of the plurality of potential bit patterns enables recovery of at least one or more of the N bits and recovering a subset of the N bits using a selected bit pattern of the plurality of potential bit patterns; and after recovering the subset of the N bits, recovering remaining bits of the N bits using ECC correction.

28. The flash memory device of claim 27, wherein the controller is configured to select the plurality of potential bit patterns for correction of one or both of over-programming and retention loss.

29. The flash memory device of claim 27, wherein the controller is configured to determine N bits of data for recovery by reading multiple times a set of bits that include the N bits of data to identify the N bits of data having inconsistent value across the multiple reading times.

30. The flash memory device of claim 29, wherein the controller is further configured to determine M bits of data are further in error; and wherein the controller is configured to iteratively determine whether the plurality of potential bit patterns enable recovery of at least one or more of the N bits by determining whether one of the potential bit patterns recovers a predetermined number of bits to correct for N+M error bits.

* * * * *

UNITED STATES PATENT AND TRADEMARK OFFICE
CERTIFICATE OF CORRECTION

PATENT NO. : 8,910,020 B2
APPLICATION NO. : 13/285873
DATED : December 9, 2014
INVENTOR(S) : Frayer et al.

It is certified that error appears in the above-identified patent and that said Letters Patent is hereby corrected as shown below:

In the Claims

Claim 1, col. 11, line 19, please delete "of recovery of bits in" and insert --of recovering bits in--;

Claim 5, col. 11, line 48, please delete "plurality potential" and insert --plurality of potential--;

Claim 6, col. 11, line 51, please delete "plurality potential" and insert --plurality of potential--;

Claim 10, col. 12, line 8, please delete "values of bits" and insert --values of one or more bits--;

Claim 15, col. 12, line 42, please delete "whether the potential" and insert --whether the plurality of potential--;

Claim 25, col. 13, line 41, please delete "part of values" and insert --part on values--;

Claim 27, col. 14, line 10, please delete "data for" and insert --data in the memory for--;

Claim 27, col. 14, line 14, please delete "correction of the one" and insert --correction of one--;

Claim 30, col. 14, line 35, please delete "data are" and insert --data that are--;

Claim 30, col. 14, line 40, please delete "the potential" and insert --the plurality of potential--.

Signed and Sealed this
Seventh Day of April, 2015

Michelle K. Lee
*Director of the United States Patent and Trademark Office*